United States Patent
Iwamoto et al.

(10) Patent No.: US 12,341,496 B2
(45) Date of Patent: Jun. 24, 2025

(54) RADIO-FREQUENCY MODULE

(71) Applicant: Murata Manufacturing Co., Ltd., Nagaokakyo (JP)

(72) Inventors: Takashi Iwamoto, Nagaokakyo (JP); Takeshi Inao, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 288 days.

(21) Appl. No.: 18/126,740

(22) Filed: Mar. 27, 2023

(65) Prior Publication Data

US 2023/0238941 A1 Jul. 27, 2023

Related U.S. Application Data

(63) Continuation of application No. PCT/JP2021/042780, filed on Nov. 22, 2021.

(30) Foreign Application Priority Data

Dec. 7, 2020 (JP) .................. 2020-202618

(51) Int. Cl.
*H03H 9/64* (2006.01)
*H03H 7/01* (2006.01)
(Continued)

(52) U.S. Cl.
CPC ........ *H03H 9/6489* (2013.01); *H03H 7/0115* (2013.01); *H03H 9/02574* (2013.01); *H03H 9/14502* (2013.01)

(58) Field of Classification Search
CPC .............. H03H 9/6489; H03H 7/0115; H03H 9/02574; H03H 9/14502; H03H 9/0547;
(Continued)

(56) References Cited

U.S. PATENT DOCUMENTS

| 2002/0067236 A1 | 6/2002 | Andoh et al. |
| 2005/0093171 A1 | 5/2005 | Sugiura |
| 2021/0203303 A1* | 7/2021 | Schiek ................... H03H 9/542 |

FOREIGN PATENT DOCUMENTS

| DE | 102018121689 B3 * | 2/2020 | ........... H03H 9/0542 |
| JP | 62142395 A | 6/1987 | |

(Continued)

OTHER PUBLICATIONS

International Search Report in PCT/JP2021/042780, mailed Feb. 22, 2022, 3 pages.

(Continued)

*Primary Examiner* — Andrea Lindgren Baltzell
*Assistant Examiner* — Kimberly E Glenn
(74) *Attorney, Agent, or Firm* — Keating & Bennett, LLP (57) ABSTRACT

A radio-frequency module includes a module substrate, an inductor, and an acoustic wave filter. The inductor overlaps at least a portion of the acoustic wave filter when seen in a plan view from the normal direction of the module substrate. The inductor includes first and second coils connected in series. Each of the first and second coils is a spiral or helical coil that is wound with more than one turn. At least a portion of the first coil overlaps the second coil when seen in a plan view from the normal direction of the module substrate. A direction of a magnetic field generated by the first coil is opposite to a direction of a magnetic field generated by the second coil.

16 Claims, 8 Drawing Sheets

(51) Int. Cl.
*H03H 9/02* (2006.01)
*H03H 9/145* (2006.01)

(58) Field of Classification Search
CPC ....... H03H 9/0576; H01F 17/00; H01F 27/00;
H01F 27/28; H01F 27/34
See application file for complete search history.

(56) References Cited

FOREIGN PATENT DOCUMENTS

| | | | |
|---|---|---|---|
| JP | 07183749 | A | 7/1995 |
| JP | 2737876 | B2 | 4/1998 |
| JP | 2000151346 | A | 5/2000 |
| JP | 2000232202 | A | 8/2000 |
| JP | 2003152589 | A | 5/2003 |
| JP | 2003347123 | A | 12/2003 |
| JP | 2004128525 | A | 4/2004 |
| JP | 2005057577 | A | 3/2005 |
| WO | 2018180176 | A1 | 10/2018 |

OTHER PUBLICATIONS

Written Opinion in PCT/JP2021/042780, mailed Feb. 22, 2022, 4 pages.

* cited by examiner

FIG.15

RADIO-FREQUENCY MODULE

CROSS REFERENCE TO RELATED APPLICATIONS

This application claims the benefit of priority to Japanese Patent Application No. 2020-202618 filed on Dec. 7, 2020 and is a Continuation Application of PCT Application No. PCT/JP2021/042780 filed on Nov. 22, 2021. The entire contents of each application are hereby incorporated herein by reference.

BACKGROUND OF THE INVENTION

1. Field of the Invention

The present disclosure relates to a radio-frequency module, and, in particular, to a technology for reducing the size of a radio-frequency module.

2. Description of the Related Art

Inductor elements in which a coil conductor having a flat spiral shape is formed on or in a substrate are disclosed in Japanese Unexamined Patent Application Publication Nos. 2004-128525, 2000-232202, 7-183749, and 2003-347123.

SUMMARY OF THE INVENTION

When an electric current flows in the flat inductor element disclosed in any of the above related art, a magnetic field is generated around the conductor, and a magnetic field is generated in the winding-axis direction of the coil conductor (that is, the normal direction of the substrate).

When such an inductor element is used in a radio-frequency module such as a filter device, the magnetic field generated by the inductor element may cause magnetic interference with another electronic component or winding around the inductor element. The magnetic interference may become a factor in generation of noise and/or deterioration in the characteristics of an apparatus. Therefore, generally in a radio-frequency module, it is necessary to form a space in which no electronic component is disposed around the inductor element, and the space obstructs reduction in the size of the radio-frequency module.

Preferred embodiments of the present invention realize reduction in sizes of radio-frequency modules including inductor devices.

A radio-frequency module according to a preferred embodiment of the present disclosure includes a module substrate, an inductor, and an electronic component on or above the module substrate. The inductor overlaps at least a portion of the electronic component when seen in a plan view from a normal direction of the module substrate. The inductor includes a first coil and a second coil that are connected in series. Each of the first coil and the second coil is a spiral or helical coil that is wound with more than one turn. The first coil is positioned so that at least a portion thereof overlaps the second coil when seen in a plan view from the normal direction of the module substrate. A direction of a magnetic field generated by the first coil is opposite to a direction of a magnetic field generated by the second coil.

With a radio-frequency module according to a preferred embodiment of the present disclosure, in the inductor included in the radio-frequency module, the two coils connected in series overlap each other when seen in a plan view and the directions of magnetic fields generated by the coils are opposite to each other. Thus, it is possible to reduce magnetic flux leakage to the outside because the magnetic fields generated by the coils cancel each other out, and a space for preventing magnetic coupling with the inductor device is not necessary. Accordingly, it is possible to realize reduction in the size of the radio-frequency module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present disclosure will be described in detail with reference to the drawings. The same or corresponding parts in the drawings will be denoted by the same numerals and description of such parts will not be repeated.

Configuration of Radio-Frequency Module

Figure 1:
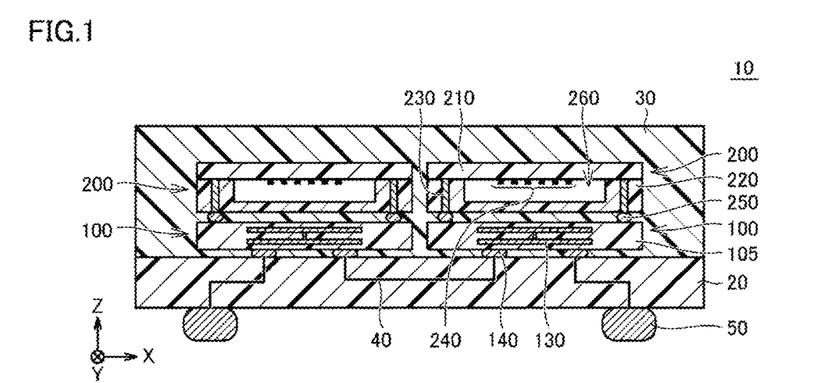
FIG. 1 is a sectional view of a radio-frequency module according to a preferred embodiment of the present invention.

FIG. 1 is a sectional view of a radio-frequency module 10 according to a preferred embodiment. FIG. 1 illustrates an example in which the radio-frequency module 10 is a diplexer that splits a received signal into two signals of different pass bands. The radio-frequency module 10 is applied, for example, to mobile terminals, which are typically mobile phones and smartphones, personal computers having a communication function, and the like.

Referring to FIG. 1, the radio-frequency module 10 includes a module substrate 20, an inductor device 100, and an electronic component 200. In the present preferred embodiment, an example in which an acoustic wave filter suitable for reduction in the size of the module is used as the electronic component 200 will be described. However, the electronic component 200 may be a filter having another configuration, such as an LC filter.

In the descriptions of FIG. 1 and other figures, the normal direction of the module substrate 20 will be referred to as "Z-axis direction", and in-plane directions of the module substrate 20 that are perpendicular to the Z-axis direction will be referred to as "X axis" and "Y axis". In the description of each figure, the positive Z-axis direction may be referred to as "upward" and the negative Z-axis direction may be referred to as "downward".

The module substrate 20 is, for example, a flat multilayer substrate made of a dielectric such as an epoxy resin. The module substrate 20 is a base component of the radio-frequency module 10, and elements such as the inductor device 100 and the electronic component 200 are mounted on or above the module substrate 20. A wiring pattern 40 formed of a conductive material such as copper, gold, or aluminum is disposed on and/or in the module substrate 20. The wiring pattern 40 is used for connection between components mounted on or above the module substrate 20 or for connection with an external apparatus via an external terminal 50.

The inductor device 100 includes a substrate 105 and a coil unit 130 in the substrate 105. In the example illustrated in FIG. 1, the inductor device 100 is a chip component. The inductor device 100 is mounted on the module substrate 20 with a terminal 140, such as a solder bump, therebetween. Detailed configuration of the inductor device 100 will be described with reference to FIG. 2 and other figures.

The electronic component 200 is disposed above the inductor device 100. The electronic component 200 is disposed so as to overlap at least a portion of the inductor device 100 when seen in a plan view from the normal direction of the module substrate 20 (Z-axis direction). As described above, in the present preferred embodiment, the electronic component 200 is a filter circuit including an acoustic wave resonator. The electronic component 200 includes a piezoelectric substrate 210, a cover unit 220, and at least one functional element 240 on the lower side of the piezoelectric substrate 210.

The piezoelectric substrate 210 is made of, for example, a piezoelectric single-crystal material such as lithium tantalate (LiTaO$_3$) or lithium niobate (LiNbO$_3$), or a multilayer body including LiTaO$_3$ or LiNbO$_3$ and alumina, silicon, sapphire, and the like.

The functional element 240 includes a pair of interdigital transducer (IDT) electrodes formed by using an electrode material such as the following: at least one elemental metal selected from aluminum, copper, silver, gold, titanium, tungsten, platinum, chrome, nickel, and molybdenum; or an alloy including any of these as a main component. In the electronic component 200, a surface acoustic wave (SAW) resonator is formed by the piezoelectric substrate 210 and the IDT electrode. The functional element 240 is formed in a hollow space 260 between the piezoelectric substrate 210 and the cover unit 220.

The cover unit 220 is made of a resin such as polyimide and includes a support portion and a cover portion. The support portion is provided around a region in which the functional element 240 is formed on the piezoelectric substrate 210, and the cover portion is supported by the support portion to form the hollow space 260. A columnar electrode 230, which protrudes downward (in the negative Z-axis direction) from the lower surface of the piezoelectric substrate 210, is formed in the support portion of the cover unit 220. The columnar electrode 230 is a member for electrically connecting the functional element 240 to an external apparatus and is made of a conductive material such as copper, gold, or aluminum. The columnar electrode 230 is connected to the inductor device 100 via a solder bump 250.

In the radio-frequency module 10 illustrated in FIG. 1, two sets of stack structures each including the inductor device 100 and the electronic component 200 are disposed on the module substrate 20. However, the number of the inductor devices 100 and/or the electronic components 200 is not limited to this.

The inductor device 100 and the electronic component 200, which are mounted on the upper side of the module substrate 20, are covered by a resin 30 for molding. For example, an epoxy resin is used as the resin 30.

In the foregoing description, a case where the electronic component is an acoustic wave filter including a SAW resonator has been described. However, a bulk acoustic wave (BAW) resonator may be used instead of the SAW resonator.

Configuration of Inductor Device

Figure 2:
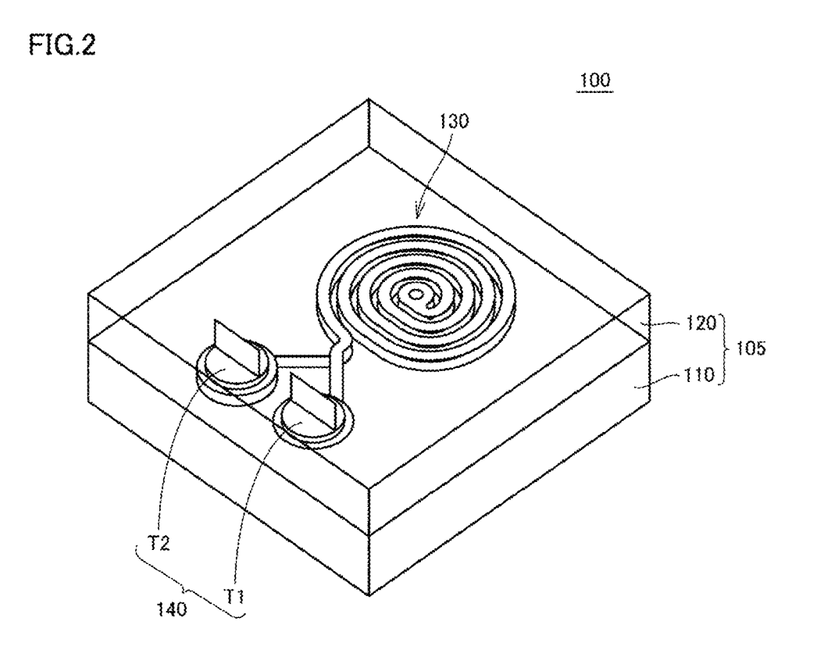
FIG. 2 is a perspective view an inductor device included in the radio-frequency module of FIG. 1.
Figure 3:
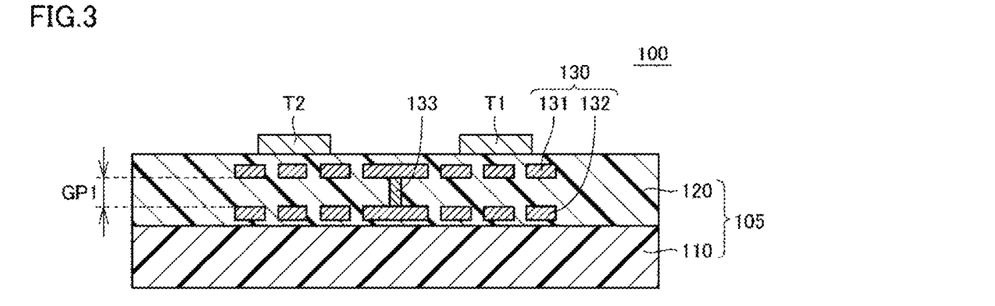
FIG. 3 is a sectional view of the inductor device of FIG. 1.

FIG. 2 is an external perspective view of the inductor device 100 to be placed in the radio-frequency module 10 of FIG. 1. FIG. 3 is a sectional view of the inductor device 100.

Referring to FIGS. 2 and 3, the inductor device 100 includes the substrate 105 including a module substrate 110 and a dielectric layer 120, the coil unit 130, and the terminal 140 (T1, T2). The module substrate 110 is a semiconductor substrate made of silicon (Si) or the like. The dielectric layer 120 is, for example, a multilayer substrate in which a plurality of dielectrics made of low temperature co-fired ceramics (LTCC) or resins are stacked. The coil unit 130 is disposed in inner layers of the dielectric layer 120. In FIG. 2, the dielectric layer 120 is illustrated transparently for ease of understanding the coil unit 130 therein.

The coil unit 130 is made of a conductive material such as copper or aluminum. The coil unit 130 includes two coils 131 (first coil) and 132 (second coil) in each of which a conductor is wound with more than one turn from the outer periphery to the inner periphery, and a connection member 133 for connecting the coils 131 and 132 in series. In the example illustrated in FIGS. 2 and 3, each of the coils 131 and 132 is a spiral coil whose conductor is disposed in the same layer in the dielectric layer 120. However, each coil may be a helical coil whose conductor becomes offset in the layer-stacking direction of the dielectric layer 120 from the outer terminal end toward the inner terminal end.

The coil 131 and the coil 132 are disposed so as to be separated by a distance GP1 in the layer-stacking direction of the dielectric layer 120. The distance GP1 may have an allowance of about ±5% over the entire coil, for example. The inner terminal end of the coil 131 is connected to the inner terminal end of the coil 132 through the connection member 133. The outer terminal end of the coil 131 is connected to the terminal T1 (first terminal) disposed on the upper surface of the dielectric layer 120. The outer terminal end of the coil 132 is connected to the terminal T2 (second terminal) disposed on the upper surface of the dielectric layer 120.

In the example illustrated in FIGS. 2 and 3, the coils 131 and 132 have the same substantially-circular outer shape, and are disposed so as to overlap each other when seen in a plan view from the normal direction of the dielectric layer 120. The shapes of the coils 131 and 132 are not limited to a circle and may be a polygon, an ellipse, a semicircle, or the like; and the coils 131 and 132 may have slight differences in shape and/or dimensions. It is sufficient that at least portions of the coils 131 and 132 overlap when seen in a plan view.

When an electric current flows in such an inductor device, a magnetic field is generated around the conductor, and a magnetic field is generated by each coil in the winding-axis direction (that is, the layer-stacking direction of the substrate). Then, due to the magnetic field generated by the inductor device, magnetic interference occurs between the inductor device and an electronic component and/or wiring disposed around the inductor device in the radio-frequency module. The magnetic interference may become a factor in generation of noise and/or deterioration in the characteristics of an apparatus. If the inductor device is disposed at a distance from other components in order to avoid the magnetic interference, the size of the entirety of the radio-frequency module becomes large and obstructs reduction in the size of the entire device.

In the inductor device 100 provided in the radio-frequency module 10 according to the present preferred embodiment, as described above, the two coils 131 and 132 are connected at the inner terminal ends thereof and are disposed so that at least portions thereof overlap when seen in a plan view from the normal direction of the substrate. When an electric current flows from the terminal T1 toward the terminal T2, the electric current flows from the outer terminal end to the inner terminal end in the coil 131, and the electric current flows from the inner terminal end to the outer terminal end in the coil 132. Since the winding directions of the coils 131 and 132 are the same, the direction of a magnetic field generated by the coil 131 and the direction of a magnetic field generated by the coil 132 are opposite to each other.

Figure 4:
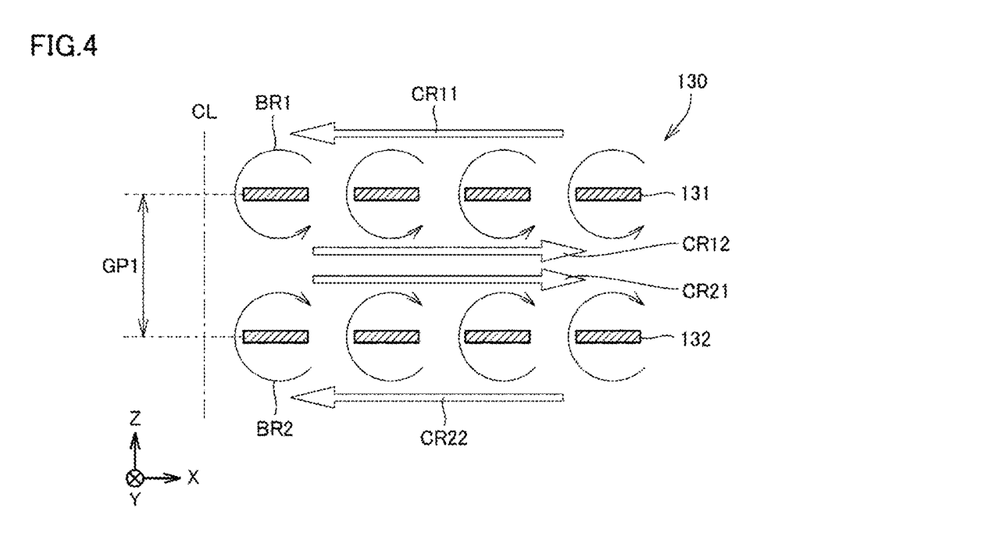
FIG. 4 illustrates magnetic fluxes generated by coils in the inductor device.

FIG. 4 illustrates magnetic fluxes generated by the coils 131 and 132 of the inductor device 100 of FIG. 1. FIG. 4 is a sectional view of a half of the coils 131 and 132 on one side of the center (center line CL). In FIG. 4, the radial direction is indicated by the X axis, and the winding-axis direction of the coil is indicated by the Z axis.

Referring to FIG. 4, when an electric current flows from the terminal T1 toward the terminal T2 as described above, the electric current flows in the negative Y-axis direction in each conductor of the coil 131 in the portion illustrated in FIG. 4. Then, a magnetic flux is generated in the direction of an arrow BR1 around each conductor of the coil 131. Between adjacent conductors of the coil 131, a magnetic flux from a conductor on the outer peripheral side is generated in the negative Z-axis direction, and a magnetic flux from a conductor on the inner peripheral side is generated in the positive Z-axis direction. Therefore, between the conductors, the magnetic flux generated from the conductor on the outer peripheral side and the magnetic flux generated from the conductor on the inner peripheral side cancel each other out. As the entirety of the coil 131, a magnetic flux in the negative Z-axis direction is generated, because the cancellation of the magnetic fluxes does not occur at a central portion of the coil and the coil length becomes larger as the conductor is positioned further on the outer peripheral side. On the upper side (facing in the positive Z-axis direction) of the coil 131, a magnetic flux is generated in the negative X-axis direction, that is, in a radial direction from the outer periphery toward the coil center (an arrow CR11 of FIG. 4).

On the other hand, on the lower side (facing in the negative Z-axis direction) of the coil 131, a magnetic flux is generated in the positive X-axis direction, that is, in a radial direction from the coil center toward the outer periphery (an arrow CR12 of FIG. 4).

On the other hand, regarding the coil 132, a magnetic flux is generated in a direction opposite to that of the coil 131, because an electric current flows in the positive Y-axis direction in each conductor. To be more specific, a magnetic flux is generated in the direction of an arrow BR1 around each conductor of the coil 132, and, in the Z-axis direction, a magnetic flux is generated in the positive Z-axis direction as the entirety of the coil 132. A magnetic flux is generated in the positive X-axis direction (an arrow CR21 of FIG. 4) on the upper side of the coil 132, and a magnetic flux is generated in the negative X-axis direction (an arrow CR22 of FIG. 4) on the lower side of the coil 132.

In this way, regarding the Z-axis direction, a magnetic field generated by one of the coils is cancelled out by a magnetic flux generated by the other coil, by disposing the coil 131 and the coil 132 close to each other in the winding-axis direction. On the other hand, regarding the X-axis direction (radial direction), although magnetic fluxes are generated in the same direction between the coils, since the distance GP1 between the coils is small, magnetic fluxes on the upper sides of the coils interfere with each other and magnetic fluxes on the lower sides of the coils interfere with each other, and portions of the magnetic fluxes cancel each other out. Accordingly, it is possible to reduce a magnetic flux that leaks to the outside from the inductor device 100 by disposing the two spiral coils, which generate magnetic fields in directions opposite to each other, close to each other in the winding-axis direction as in the inductor device 100 according to the present preferred embodiment. Thus, it is possible to reduce or prevent deterioration in the characteristics of the radio-frequency module 10, because it is possible to reduce or prevent an effect of magnetic flux leakage on the electronic component 200. Moreover, as illustrated in FIG. 1, although the wiring pattern 40 is formed in a region that overlaps the inductor device 100 when seen in a plan view from the normal direction of the module substrate 20, it is possible to reduce or prevent an effect of magnetic flux leakage on the wiring pattern 40. Furthermore, it is possible to realize reduction in the size of the entirety of an apparatus, because it is possible to dispose the inductor device 100 close to the electronic component 200 and other components due to reduction of magnetic flux leakage.

Connection Configuration

Next, referring to FIGS. 5 to 8, variations in connection of the coils 131 and 132 in the inductor device 100 will be described. In the descriptions of FIGS. 5 to 8, magnetic fields generated in the winding-axis direction will be mainly described.

Figure 5:
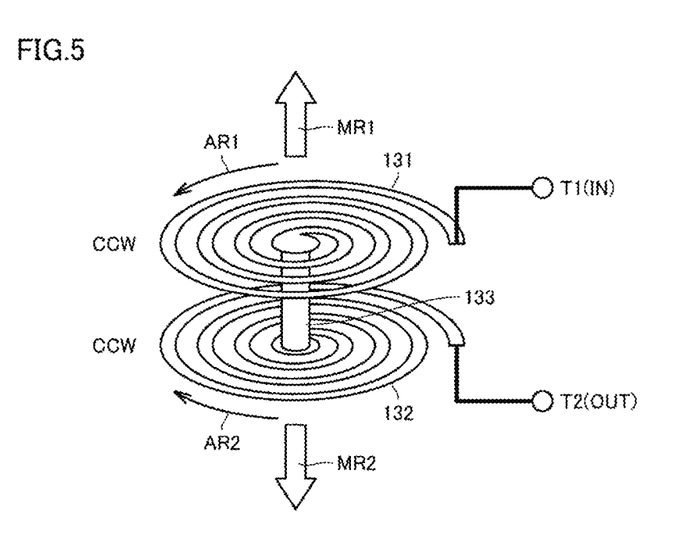
FIG. 5 illustrates a first example of coil connection.

In the example illustrated in FIG. 5, both of the coil 131 and the coil 132 are wound in the counterclockwise (CCW) direction from the outer terminal end toward the inner terminal end, and the inner terminal ends are connected to each other through the connection member 133. The connection member 133 is a linear via extending in the layer-stacking direction of the substrate. With such a connection configuration, when an electric current is made to flow from the terminal T1 to the terminal T2, the electric current flows through the coil 131 in the direction of an arrow AR1 of FIG. 5 (that is, the CCW direction). Thus, a magnetic field is generated upward (the direction of an arrow MR1) from the coil 131. On the other hand, the electric current flows through the coil 132 in the direction of an arrow AR2 of FIG.

5 (that is, the clockwise (CW) direction) from the inner terminal end toward the outer terminal end. Thus, a magnetic field is generated downward (the direction of an arrow MR2) from the coil 132. Accordingly, the magnetic field generated by one of the coils is cancelled out by the magnetic field generated by the other coil.

Figure 6:
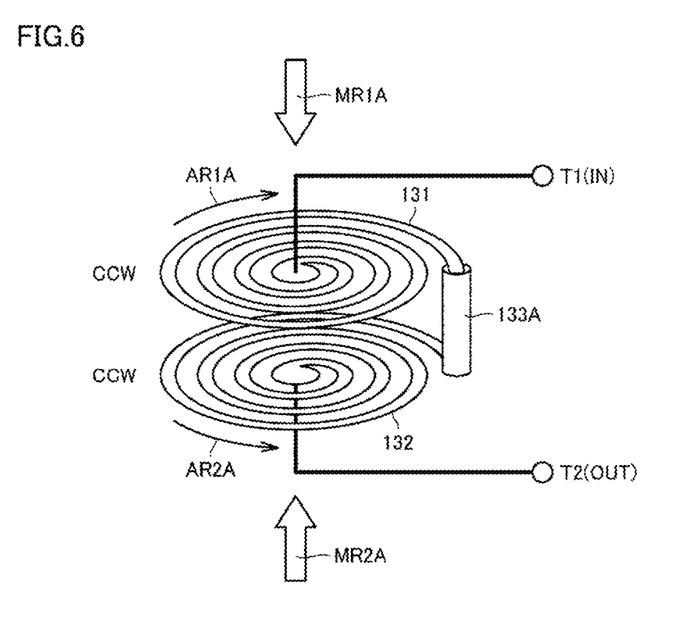
FIG. 6 illustrates a second example of coil connection.

In the example illustrated in FIG. 6, both of the coil 131 and the coil 132 are wound in the counterclockwise (CCW) direction from the outer terminal end toward the inner terminal end, in the same way as in FIG. 5. However, the outer terminal ends of the coil 131 and the coil 132 are connected to each other through a connection member 133A. The inner terminal end of the coil 131 is connected to the terminal T1, and the inner terminal end of the coil 132 is connected to the terminal T2.

With such a connection configuration, when an electric current is made to flow from the terminal T1 to the terminal T2, the electric current flows through the coil 131 in the direction of an arrow AR1A of FIG. 6 (the CW direction), and the electric current flows through the coil 132 in the direction of an arrow AR2A of FIG. 6 (the CCW direction). Therefore, a magnetic field is generated downward (the direction of an arrow MR1A) from the coil 131, and a magnetic field is generated upward (the direction of an arrow MR2A) from the coil 132. Accordingly, the magnetic field generated by one of the coils is cancelled out by the magnetic field generated by the other coil.

In FIGS. 5 and 6, the winding directions of both of the coils 131 and 132 may be the CW direction. In this case, the direction of a magnetic field formed by each coil is opposite to that in the figures.

Figure 7:
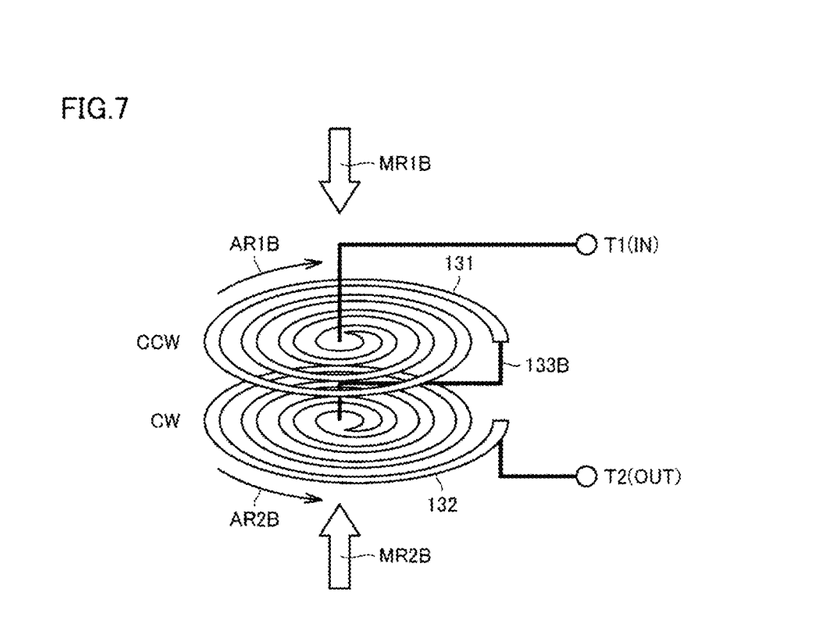
FIG. 7 illustrates a third example of coil connection.
Figure 8:
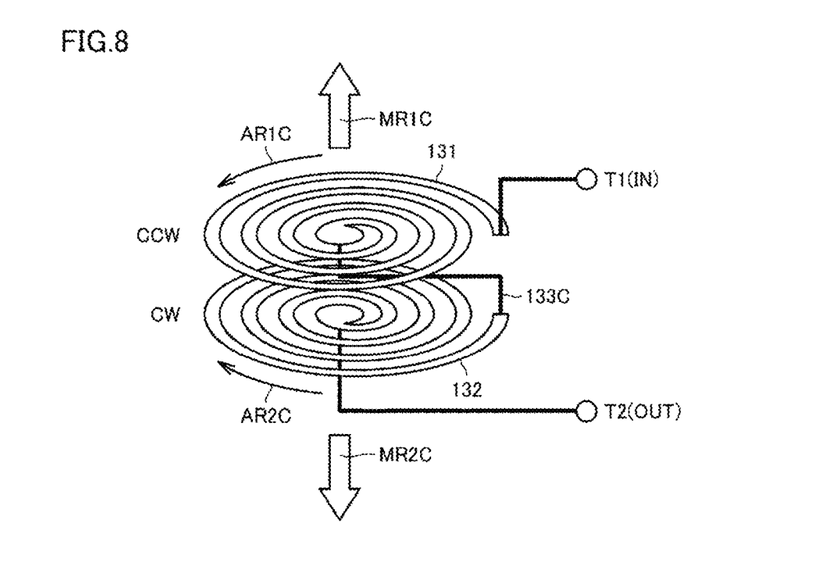
FIG. 8 illustrates a fourth example of coil connection.

FIGS. 7 and 8 illustrate examples in which the winding directions of the coil 131 and the coil 132 are opposite to each other.

In the example illustrated in FIG. 7, the coil 131 is wound in the CCW direction from the outer terminal end toward the inner terminal end. On the other hand, the coil 132 is wound in the CW direction from the outer terminal end toward the inner terminal end. The inner terminal end of the coil 131 is connected to the terminal T1, and the outer terminal end of the coil 131 is connected to the inner terminal end of the coil 132. The outer terminal end of the coil 132 is connected to the terminal T2.

With such a connection configuration, when an electric current is made to flow flows from the terminal T1 to the terminal T2, the electric current flows through the coil 131 in the direction of an arrow AR1B of FIG. 7 (the CW direction), and the electric current flows through the coil 132 in the direction of an arrow AR2B of FIG. 7 (the CCW direction). Therefore, a magnetic field is generated downward (the direction of an arrow MR1B) from the coil 131, and a magnetic field is generated upward (the direction of an arrow MR2B) from the coil 132. Accordingly, the magnetic field generated by one of the coils is cancelled out by the magnetic field generated by the other coil.

In the example illustrated in FIG. 8, the coil 131 is wound in the CCW direction from the outer terminal end toward the inner terminal end, and the coil 132 is wound in the CW direction from the outer terminal end toward the inner terminal end. The outer terminal end of the coil 131 is connected to the terminal T1, and the inner terminal end of the coil 131 is connected to the outer terminal end of the coil 132. The inner terminal end of the coil 132 is connected to the terminal T2.

With such a connection configuration, when an electric current is made to flow from the terminal T1 to the terminal T2, the electric current flows through the coil 131 in the direction of an arrow AR1C of FIG. 8 (the CCW direction), and the electric current flows through the coil 132 in the direction of an arrow AR2C of FIG. 8 (the CW direction). Therefore, a magnetic field is generated upward (the direction of an arrow MR1C) from the coil 131, and a magnetic field is generated downward (the direction of an arrow MR2C) from the coil 132. Accordingly, the magnetic field generated by one of the coils is cancelled out by the magnetic field generated by the other coil.

Effect of Suppressing Magnetic Flux Leakage

Next, an effect of suppressing magnetic flux leakage of the inductor device 100 will be described by using a comparative example.

Figure 9A:
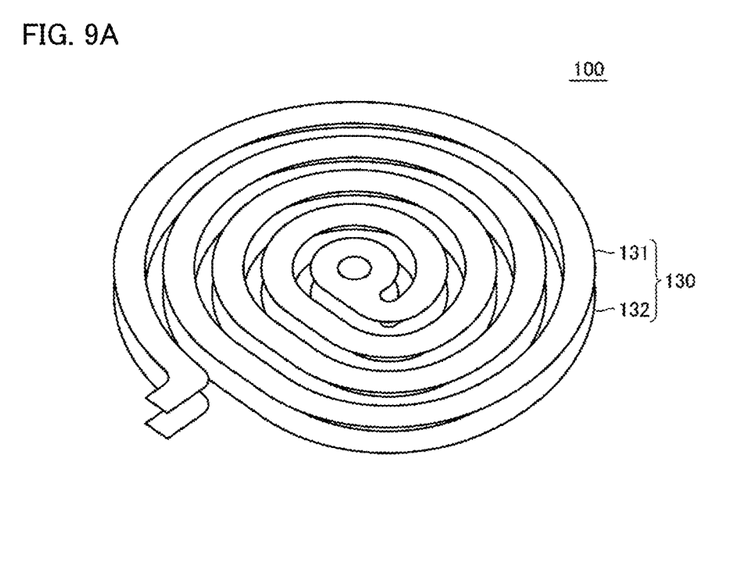
FIGS. 9A and 9B illustrate coil units of the inductor device according to the present preferred embodiment of the present invention and an inductor device according to a comparative example.
Figure 9B:
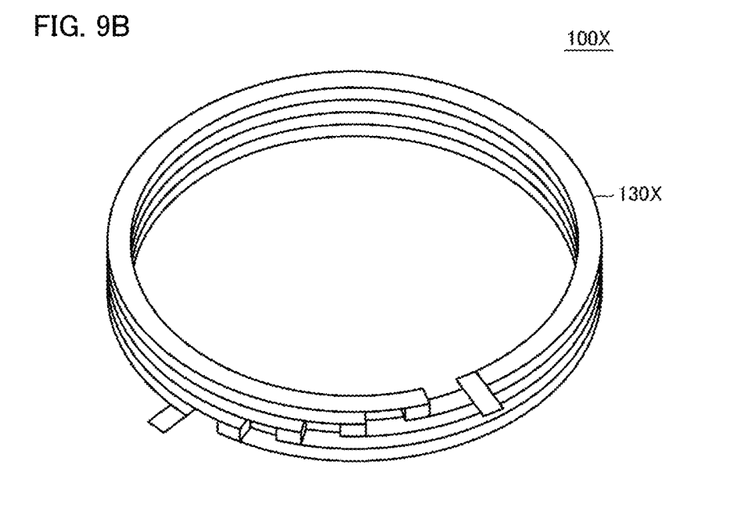

FIGS. 9A and 9B illustrate a coil unit of the inductor device 100 to be placed in the radio-frequency module 10 and a coil unit of an inductor device 100X according to the comparative example. FIG. 9A illustrates only the coil unit 130 of FIG. 2. As described above, the coil unit 130 has a configuration such that the two spiral coils 131 and 132 having the same shape are disposed so as to be separated in the winding-axis direction.

FIG. 9B illustrates a coil unit 130X of the inductor device 100X according to the comparative example. The coil unit 130X according to the comparative example is a helical coil in which a plurality of coils having the same diameter are connected through vias in the layer-stacking direction of the dielectric layer. When an electric current flows in the coil unit 130X, magnetic fields are generated in the same direction from the plurality of coils, because the coils are wound in the same direction in the coil unit 130X.

Figure 10:
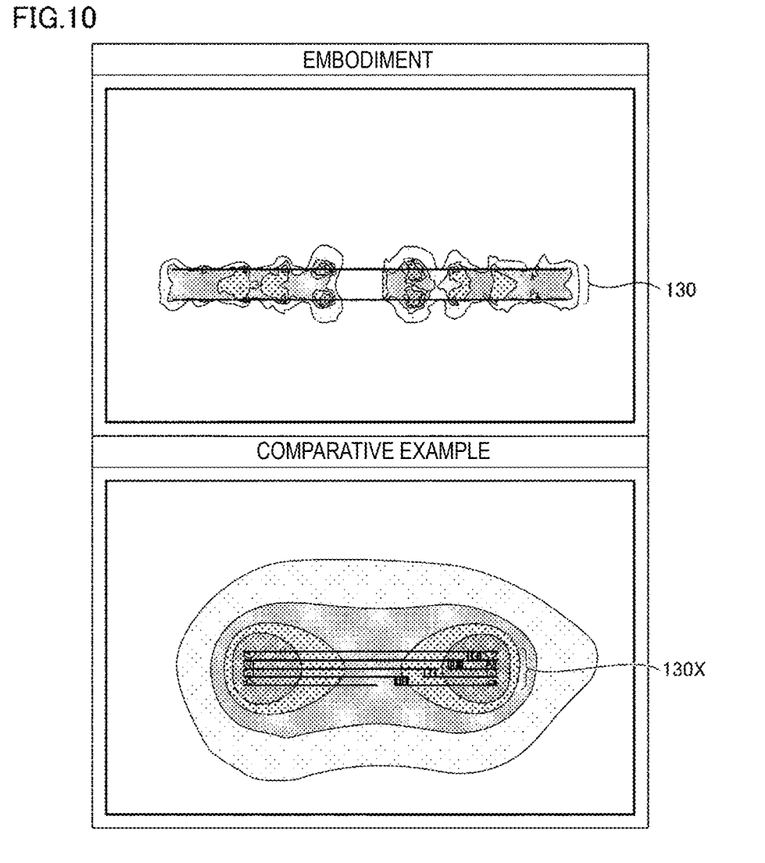
FIG. 10 illustrates examples of magnetic flux density distributions in the inductor device according to the present preferred embodiment of the present invention and the inductor device according to the comparative example.

FIG. 10 illustrates an example of the result of simulating the magnetic-field-density distributions of the inductor device 100 to be placed in the radio-frequency module 10 and the inductor device 100X according to the comparative example. In FIG. 10, magnetic flux density in a section including the winding axis is represented by shading density, and a portion having high magnetic flux density is illustrated with dense hatching. It can be seen from FIG. 10 that, with the coil unit 130X according to the comparative example, a region close to the conductor and having high magnetic flux density is larger than that of the coil unit 130 according to the present preferred embodiment, and the magnetic flux is distributed widely to a portion away from the coil unit 130X. On the other hand, with the coil unit 130 according to the present preferred embodiment, a region having high magnetic flux density is limited to the close vicinity of the conductor. Moreover, the magnetic flux is confined in a region between the two coils 131 and 132, and the distribution of the magnetic flux is more restricted than that of the comparative example.

In this way, with the inductor device 100 included in the radio-frequency module 10 according to the present preferred embodiment, it is possible to reduce or prevent an effect on the electronic component 200 and wiring disposed adjacent to the inductor device 100, because it is possible to reduce a magnetic flux that leaks to the outside from the coil unit 130. Moreover, it is possible to reduce the size of the entirety of the radio-frequency module, because, for the above reason, it is possible to reduce the distance between the electronic component 200 and the inductor device.

In general, the intensity of a magnetic field generated by a coil decreases with increasing distance from the coil. Therefore, it is preferable that the distance GP1 between the coils 131 and 132 be as short as possible in order to increase the effect of canceling out magnetic fields generated by the coils. On the other hand, if the distance GP1 between the coils is reduced, the Q factor may decrease, because magnetic fluxes on the upper side of the coil 131 and on the lower side of the coil 132 are reduced.

Figure 11:
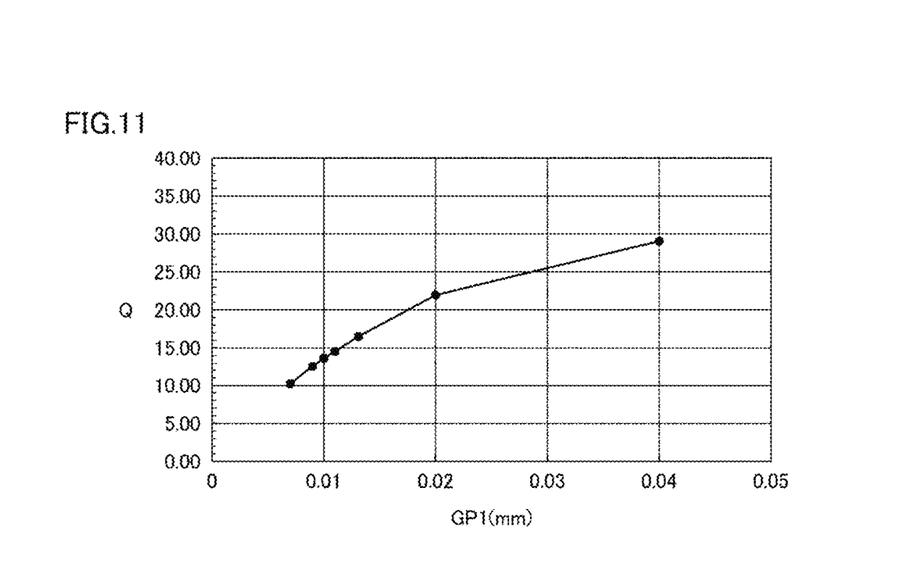
FIG. 11 illustrates the relationship between the distance between coils and the Q factor.

FIG. 11 illustrates the relationship between the distance GP1 between the coils and the Q factor when a radio-frequency signal in 3 GHz band is input. In FIG. 11, the horizontal axis represents the distance GP1 between the coil 131 and the coil 132, and the vertical axis represents the Q factor. As illustrated in FIG. 11, the Q factor decreases as the distance GP1 between the coils decreases. In the example of the present preferred embodiment, the distance GP1 preferably is about 0.01 mm or larger, because a Q factor of about 13.0 or higher is preferred. Although not illustrated in the figure, when the distance GP1 becomes larger than about 0.1 mm, the effect of cancelling out magnetic fields decreases and the distribution of the magnetic flux becomes wider. Therefore, it is preferable that the distance GP1 between the coils be in the range of about 0.01 mm to about 0.1 mm (about 0.01 mm GP1 about 0.1 mm).

Modifications

Hereafter, modifications of the radio-frequency module will be described.

First Modification

Figure 12:
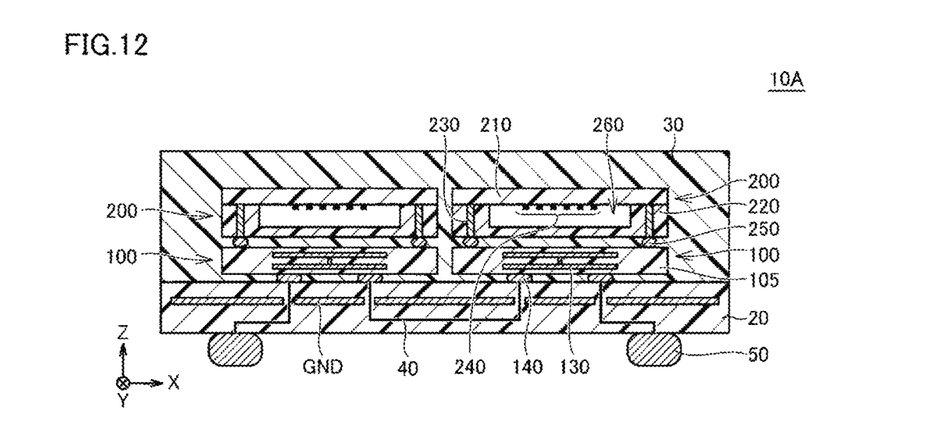
FIG. 12 is a sectional view of a radio-frequency module according to a first modification of a preferred embodiment of the present invention.

FIG. 12 is a sectional view of a radio-frequency module 10A according to a first modification of a preferred embodiment of the present invention. The radio-frequency module 10A has a configuration such that a ground electrode GND is disposed in the module substrate 20, in addition to the configuration of the radio-frequency module 10 according to the present preferred embodiment. Description of elements in FIG. 12 that are the same as those of FIG. 1 will not be repeated.

Referring to FIG. 12, in the radio-frequency module 10A, the ground electrode GND having a flat shape is disposed in the module substrate 20 as described above. The ground electrode GND is disposed so that at least a portion thereof overlaps the inductor device 100 when seen in a plan view from the Z-axis direction. In the module substrate 20, the wiring pattern 40 extends below the ground electrode GND, is bent upward at a position directly below the terminal 140 of the inductor device 100, extends through the ground electrode GND, and is connected to the terminal 140.

The ground electrode GND is to be connected, via the external terminal 50, to a reference potential on a mount substrate (not shown) on which the radio-frequency module 10A is to be mounted. The ground electrode GND functions as a shield between internal circuits (the inductor device 100, the electronic component 200) of the radio-frequency module 10A and the mount substrate. On the other hand, if a magnetic flux generated by the inductor device 100 magnetically couples with the ground electrode GND, the Q factor decreases, and the characteristics of the radio-frequency module may deteriorate.

However, as described above, with the inductor device 100, leakage of the magnetic flux is reduced due to the two coils that generate magnetic fields in directions opposite to each other. Therefore, magnetic coupling between the inductor device 100 and the ground electrode GND is weak, although the inductor device 100 and the ground electrode GND overlap when seen in a plan view. Therefore, it is possible to reliably limit the effect of noise and the like from the mount substrate by using the ground electrode GND while reducing or preventing a decrease of the Q factor.

If the effect of noise or the like from the outside is small, the ground electrode GND may be omitted as in FIG. 1. Alternatively, in order to reduce the effect from the outside while further reducing or preventing a decrease of the Q factor, the ground electrode GND may be disposed in a region that does not overlap the inductor device 100 when seen in a plan view.

Second Modification

In the above-described preferred embodiments and the first modification, a configuration in which an inductor device is disposed for each of acoustic wave filters (electronic components) has been described. However, there may be a case where an inductor device is shared by a plurality of electronic components, depending on the circuit configuration of the radio-frequency module. An example is a case of performing, in a diplexer, impedance matching with an antenna to which two filter circuits are connected.

Figure 13:
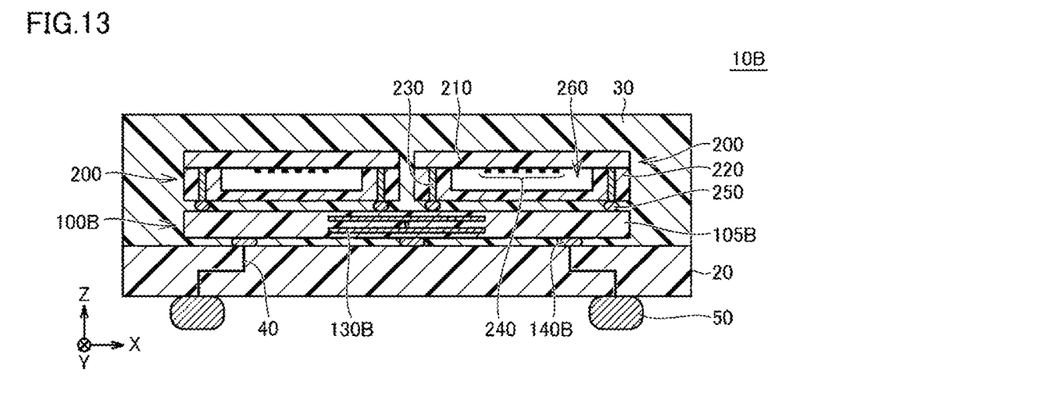
FIG. 13 is a sectional view of a radio-frequency module according to a second modification of a preferred embodiment of the present invention.

FIG. 13 is a sectional view of a radio-frequency module 10B according to a second modification of a preferred embodiment of the present invention. In the radio-frequency module 10B, one inductor device 100B, instead of the two inductor devices 100 in FIG. 1, is connected to two electronic components 200. The two electronic components 200 are disposed on the inductor device 100B. Alternatively, one of the electronic components 200 may be disposed on the inductor device 100B, and the other electronic component 200 may be disposed directly on the module substrate 20.

As with the inductor device 100, the inductor device 100B includes a substrate 105B, a coil unit 130B disposed in the substrate 105B, and a terminal 140B for connection with the outside. Description of detailed configurations of the inductor device 100B, which are the same as those of the inductor device 100, will not be repeated.

Also when an inductor device is shared by a plurality of electronic components in this way, it is possible to reduce or prevent deterioration in the characteristics of the radio-frequency module, because it is possible to reduce magnetic flux leakage from the inductor device by disposing, in the inductor device, two coils that generate magnetic fields in directions opposite to each other so as to overlap in the winding direction.

Third Modification

In the above-described preferred embodiments and the first and second modifications, a configuration in which an inductor device is disposed between an electronic component and a module substrate has been described. In a third modification of a preferred embodiment of the present invention, a configuration in which an inductor device is disposed on an electronic component will be described.

Figure 14:
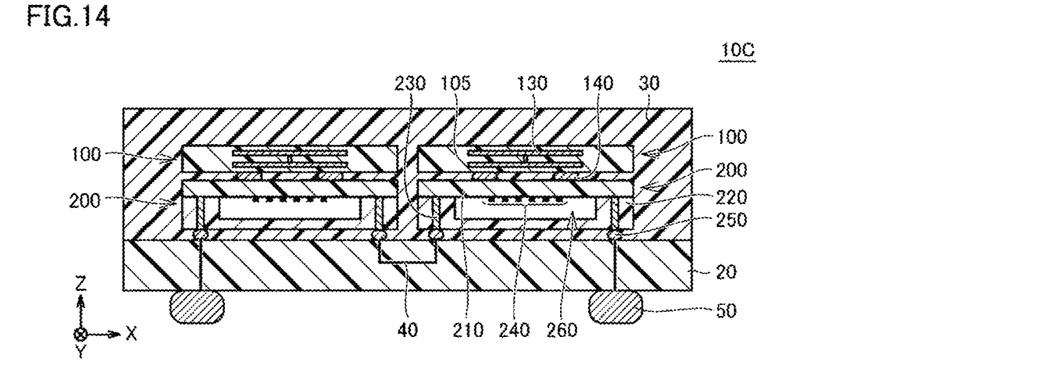
FIG. 14 is a sectional view of a radio-frequency module according to a third modification of a preferred embodiment of the present invention.

FIG. 14 is a sectional view of a radio-frequency module 10C according to the third modification. Referring to FIG. 14, in the radio-frequency module 10C, the module substrate 20 is disposed on an electronic component 200 and an inductor device 100 is disposed on the electronic component 200. Description of the configuration of each of the inductor device 100 and the electronic component 200, which is the same as that of the above-described preferred embodiments, will not be repeated.

With the disposition in the radio-frequency module 10C, the inductor device 100 is disposed at a position close to the upper surface of the resin 30 for molding. Therefore, the effect of magnetic flux that leaks to the outside from the upper side of the radio-frequency module may pose a problem, compared with the case of FIG. 1. However, the magnetic flux that leaks from the inductor device 100 is reduced because, in the inductor device 100, two coils that generate magnetic fields in directions opposite to each other are disposed so as to overlap in the winding-axis direction as described above. Accordingly, also with the disposition of the inductor device 100 in FIG. 14, it is possible to reduce the effect of leakage magnetic flux on an external apparatus.

Fourth Modification

In the above-described preferred embodiments and each modification, a configuration in which an inductor device is formed as an individual chip component has been described. In a fourth modification, a configuration in which an inductor device is formed in an internal wiring layer of a module substrate will be described.

Figure 15:
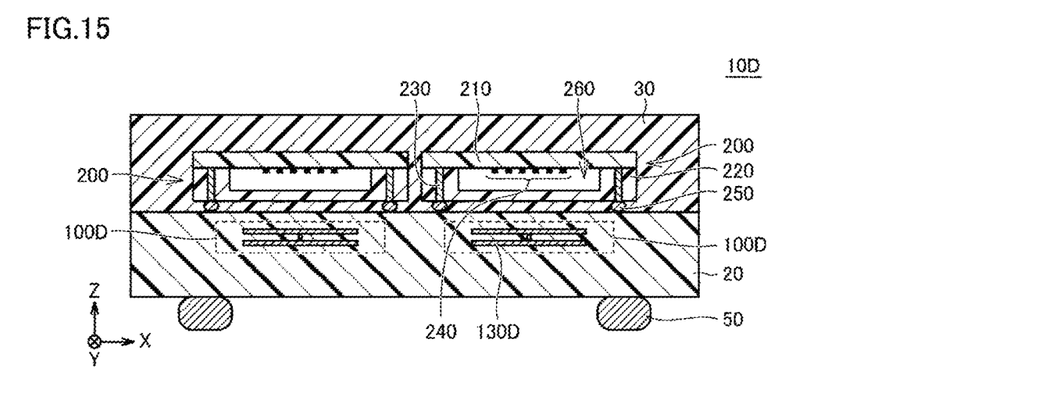
FIG. 15 is a sectional view of a radio-frequency module according to a fourth modification of a preferred embodiment of the present invention.

FIG. 15 is a sectional view of a radio-frequency module 10D according to the fourth modification. Referring to FIG. 15, the electronic component 200 is mounted directly on the module substrate 20 in the radio-frequency module 10D. When seen in a plan view from the normal direction of the module substrate 20, a coil unit 130D of an inductor device 100D is formed in a region that overlaps the electronic component 200 in the module substrate 20. It is possible to reduce a magnetic flux that leaks from the coil unit 130D, because the coil unit 130D has a configuration similar to that of the coil unit 130 of FIG. 1.

Moreover, it is possible to realize further reduction in size, because the coil unit 130D is formed in the module substrate 20 and thus the dimensions of the radio-frequency module 10D in the thickness direction (Z-axis direction) can be reduced compared with a case of mounting a chip component. In addition, it is possible to contribute to reduction of manufacturing cost, because a process of mounting the inductor device is not necessary.

On the other hand, when an inductor device is formed in a module substrate as in the fourth modification, it is not necessarily possible to use a material suitable for the inductor device, because a material suitable for the module substrate is used as the substrate material. For example, an epoxy material used for the module substrate has a relative permittivity of about 4.2 and a dielectric loss tangent (tan 5) of about 0.008 at 1 GHz. In contrast, a fluorocarbon resin used for a chip component of the inductor device has a relative permittivity of about 2.3 and a dielectric loss tangent of about 0.001 at 1 GHz. When the fluorocarbon resin is used, it is possible to obtain inductance characteristics better that those of a case where the epoxy material is used. That is, whether to form the inductor device as a chip component or to form the inductor device in the module substrate is appropriately selected in consideration of characteristics and apparatus size required for the inductor device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A radio-frequency module comprising:
a module substrate;
an inductor; and
an electronic component on or above the module substrate; wherein
the inductor overlaps at least a portion of the electronic component when seen in a plan view from a normal direction of the module substrate;
the inductor includes a first coil and a second coil that are connected in series;
each of the first coil and the second coil is a spiral or helical coil that is wound with more than one turn;
at least a portion of the first coil overlaps the second coil when seen in a plan view from the normal direction of the module substrate;
a direction of a magnetic field generated by the first coil is opposite to a direction of a magnetic field generated by the second coil;
the first coil and the second coil are wound in a same direction when seen in a plan view from the normal direction; and
the inductor further includes:
a first terminal connected to the first coil; and
a second terminal connected to the second coil; wherein
each of the first coil and the second coil includes an outer terminal end and an inner terminal end;
the inner terminal end of the first coil is connected to the first terminal;
the inner terminal end of the second coil is connected to the second terminal; and
the outer terminal end of the first coil and the outer terminal end of the second coil are connected.

2. The radio-frequency module according to claim 1, wherein a distance between the first coil and the second coil in the normal direction is about 0.1 mm or smaller.

3. The radio-frequency module according to claim 2, wherein the distance between the first coil and the second coil in the normal direction is about 0.01 mm or larger.

4. The radio-frequency module according to claim 1, wherein the first coil and the second coil have a same shape and same dimensions and overlap when seen in a plan view from the normal direction.

5. The radio-frequency module according to claim 1, wherein
the inductor is on the module substrate; and
the electronic component is on the inductor.

6. The radio-frequency module according to claim 1, wherein
the electronic component is on the module substrate; and
the inductor is on the electronic component.

7. The radio-frequency module according to claim 1, wherein the inductor is in the module substrate.

8. The radio-frequency module according to claim 1, wherein
the module substrate includes a ground electrode; and
at least a portion of the ground electrode is in a region that overlaps the inductor when seen in a plan view from the normal direction of the module substrate.

9. The radio-frequency module according to claim 1, wherein
the module substrate includes a ground electrode; and
the ground electrode is in a region that does not overlap the inductor when seen in a plan view from the normal direction of the module substrate.

10. The radio-frequency module according to claim 1, wherein wiring is provided in the module substrate in a region that overlaps the inductor when seen in a plan view from the normal direction of the module substrate.

11. The radio-frequency module according to claim 1, wherein the electronic component is an acoustic wave filter.

12. The radio-frequency module according to claim 1, wherein the radio-frequency module is a diplexer.

13. The radio-frequency module according to claim 1, wherein the electronic component is an LC filter.

14. A mobile terminal comprising:
the radio-frequency module according to claim 1.

15. A radio-frequency module comprising:
a module substrate;
an inductor; and
an electronic component on or above the module substrate; wherein
the inductor overlaps at least a portion of the electronic component when seen in a plan view from a normal direction of the module substrate;
the inductor includes a first coil and a second coil that are connected in series;
each of the first coil and the second coil is a spiral or helical coil that is wound with more than one turn;
at least a portion of the first coil overlaps the second coil when seen in a plan view from the normal direction of the module substrate;
a direction of a magnetic field generated by the first coil is opposite to a direction of a magnetic field generated by the second coil;
the first coil and the second coil are wound in directions opposite to each other when seen in a plan view from the normal direction; and
the inductor further includes:
a first terminal connected to the first coil; and
a second terminal connected to the second coil; wherein
each of the first coil and the second coil includes an outer terminal end and an inner terminal end;
the outer terminal end of the first coil is connected to the first terminal;
the inner terminal end of the second coil is connected to the second terminal; and
the inner terminal end of the first coil and the outer terminal end of the second coil are connected.

16. A radio-frequency module comprising:
a module substrate;
an inductor; and
an electronic component on or above the module substrate; wherein
the inductor overlaps at least a portion of the electronic component when seen in a plan view from a normal direction of the module substrate;
the inductor includes a first coil and a second coil that are connected in series;
each of the first coil and the second coil is a spiral or helical coil that is wound with more than one turn;
at least a portion of the first coil overlaps the second coil when seen in a plan view from the normal direction of the module substrate;
a direction of a magnetic field generated by the first coil is opposite to a direction of a magnetic field generated by the second coil;
the first coil and the second coil are wound in directions opposite to each other when seen in a plan view from the normal direction; and
the inductor further includes:
a first terminal connected to the first coil; and
a second terminal connected to the second coil; wherein
each of the first coil and the second coil includes an outer terminal end and an inner terminal end;
the inner terminal end of the first coil is connected to the first terminal;
the outer terminal end of the second coil is connected to the second terminal; and
the outer terminal end of the first coil and the inner terminal end of the second coil are connected.

* * * * *